United States Patent
Takahashi et al.

(10) Patent No.: US 8,377,203 B2
(45) Date of Patent: Feb. 19, 2013

(54) OXIDE SINGLE CRYSTAL AND METHOD FOR PRODUCTION THEREOF, AND SINGLE CRYSTAL WAFER

(75) Inventors: Katsuaki Takahashi, Kanagawa (JP); Keisuke Mochizuki, Kanagawa (JP); Shuichi Kawaminami, Kanagawa (JP); Yoshikatsu Higuchi, Saitama (JP); Masayuki Sugawara, Saitama (JP); Susumu Nakayama, Ehime (JP)

(73) Assignee: Honda Motor Co., Ltd., Tokyo (JP)

( * ) Notice: Subject to any disclaimer, the term of this patent is extended or adjusted under 35 U.S.C. 154(b) by 1176 days.

(21) Appl. No.: 11/919,155

(22) PCT Filed: Apr. 27, 2006

(86) PCT No.: PCT/JP2006/308810
§ 371 (c)(1),
(2), (4) Date: Jan. 24, 2008

(87) PCT Pub. No.: WO2006/118177
PCT Pub. Date: Nov. 9, 2006

(65) Prior Publication Data
US 2009/0317682 A1 Dec. 24, 2009

(30) Foreign Application Priority Data
Apr. 28, 2005 (JP) .................................. 2005-131816

(51) Int. Cl.
*C30B 15/02* (2006.01)
(52) U.S. Cl. ................ 117/13; 117/11; 117/19; 117/21; 117/35; 117/36; 117/73; 117/76; 117/78
(58) Field of Classification Search .................... 429/33; 117/35, 13, 11, 19, 21, 36, 73, 76, 78, 944
See application file for complete search history.

(56) References Cited

U.S. PATENT DOCUMENTS

| | | | |
|---|---|---|---|
| 2004/0107893 A1* | 6/2004 | Nawata et al. | 117/13 |
| 2004/0161651 A1* | 8/2004 | Higuchi et al. | 429/33 |

FOREIGN PATENT DOCUMENTS

| | | | |
|---|---|---|---|
| JP | 04-175297 | * | 6/1992 |
| JP | 04-175297 A | | 6/1992 |
| JP | 11-071169 A | | 3/1999 |
| JP | 11-130595 A | | 5/1999 |

OTHER PUBLICATIONS

Tao, Shanwen; Irvine, John T.S. "Preparation and characerisation of apatite-type lanthanum silicates by a sol-gel process". Published online May 29, 2001. Material Research Bulletin 36(2001) 1245-1258.*

(Continued)

*Primary Examiner* — Michael Kornakov
*Assistant Examiner* — Kenneth A Bratland, Jr.
(74) *Attorney, Agent, or Firm* — Holtz, Holtz, Goodman & Chick PC

(57) ABSTRACT

An oxide single crystal having a composition represented by $RE_xSi_6O_{1.5x+12}$ (RE: La, Ce, Pr, Nd, or Sm, x: 8 to 10) is grown by using the Czochralski method such that the crystal growth orientation coincides with the c-axis direction. The solidification rate (the weight of the grown crystal÷the weight of the charged raw material) in the crystal growth is less than 45%.

14 Claims, 1 Drawing Sheet

OTHER PUBLICATIONS

Higuchi et al., "Single crystal growth and oxide ion conductivity of apatite-type rare-earth silicates". Published online Sep. 11, 2004. Solid State Ionics 174(2004) 73-80. See attachment.*

Islam et al., "An apatite for fast oxide ion conduction". First published on the web May 21, 2003. Chem.Commun., Issue 13, 2003 (1486-1487). See attachment.*

Journal article to S. Tao, et al. entitled "Preparation and characterisation of apatite-type lanthanum silicates by a sol-gel proces," Mat. Res. Bull. 36, 1245 (2001).*

S. Nakayama et al, "Oxide Ionic Conductivity of Apatite Type . . . ", *Journal of the European Ceramic Soc.*, vol. 19, pp. 507-510 (1999).

S. Nakayama et al, "Ionic conductivities of apatite type . . . ", *Journal of Materials Science*, vol. 19, pp. 91-93 (2000).

S. Nakayama et al, "Electrical properties of apatite-type oxide ionic conductors . . . ", *Journal of Materials Science Letters*, vol. 20, pp. 913-915 (2001).

H. Okudera et al, "Structure of oxide ion-conducting lanthanum oxyapatite . . . ", *Solid State Ionics*, vol. 176, pp. 1473-1478 (2005).

S. Tao et al, "Preparation and characterisation of apatite-type lanthanum silicates . . . ", *Materials Research Bulletin*, vol. 36, pp. 1245-1258 (2001).

* cited by examiner

OXIDE SINGLE CRYSTAL AND METHOD FOR PRODUCTION THEREOF, AND SINGLE CRYSTAL WAFER

This application is the United States national phase application of International Application PCT/JP2006/308810 filed Apr. 27, 2006.

TECHNICAL FIELD

The present invention relates to an oxide single crystal produced by the Czochralski method, a method of producing the same, and a single crystal wafer manufactured from the produced oxide single crystal.

BACKGROUND ART

An oxide having a chemical composition represented by $La_{9.33}Si_6O_{26}$ (to be referred to as "an LSO" hereinafter) is known as an example of oxide ion conductors, and examined to be applied to an oxygen sensor and an electrolyte film of a solid-state electrolytic fuel cell to be used at high temperatures (for example, see Patent Document 1).

The ion conductivity of this LSO has crystal anisotropy; the LSO shows a high ion conductivity in its c-axis direction. Accordingly, the ion conductivity of the LSO in the form of a polycrystal is extremely lower than the physical property value. To use the LSO as a single crystal, therefore, a single crystal growing method using, e.g., the Bridgman method or the floating zone melting method (FZ) is being examined (for example, see Patent Document 2).

Unfortunately, it is difficult for the Bridgman method or the floating zone melting method to grow large single crystals. Also, the LSO has a formula represented by $La_xSi_6O_{1.5x+12}$, and forms a solid solution within the range of x=8 to 10. When growing an LSO single crystal from a melt having a composition represented by $(La_{9.33}Si_6O_{26})$ where x=9.33, for example, the initial crystal is richer in Si than x=9.33, so the composition of the melt gradually becomes rich in La as the crystal growth progresses. In other words, since the composition of the melt changes to an La rich composition, the composition of the grown single crystal also changes to an La rich composition. When the composition thus changes in the same single crystal, the lattice constant in the crystal changes, strains build up in the crystal, and cracking readily occurs. This also makes the growth of large single crystals difficult.

Patent Document 1: Jpn. Pat. Appln. KOKAI Publication No. 11-71169

Patent Document 2: Jpn. Pat. Appln. KOKAI Publication No. 11-130595

DISCLOSURE OF INVENTION

It is an object of the present invention to provide an oxide single crystal production method of growing an oxide single crystal having a practical size and no cracks.

It is another object of the present invention to provide an oxide single crystal produced by this production method.

It is still another object of the present invention to provide a single crystal wafer obtained by processing the oxide single crystal.

The present inventor has made extensive studies and found that a high-quality single crystal having a practical size can be obtained by controlling the single crystal growth conditions by using the Czochralski method, which is a versatile method, thereby completing the present invention.

According to the first aspect of the present invention, there is provided an oxide single crystal having a composition represented by $RE_xSi_6O_{1.5x+12}$ (RE: La, Ce, Pr, Nd, or Sm, x: 8 to 10), and having crystal growth orientation in the c-axis direction.

According to the second aspect of the present invention, there is provided an oxide single crystal production method of producing the above oxide single crystal, wherein the Czochralski method is used, and the solidification rate (the weight of the grown crystal÷the weight of the charged raw material) in crystal growth is less than 45%.

In this oxide single crystal production method, the initial growth angle of crystal growth is preferably 90° or more. In addition, the oxide single crystal is preferably grown from a raw material obtained by wet-mixing a compound containing RE and a compound containing Si, drying the mixture, molding the dried mixture, and sintering the molded mixture at a temperature of 1,200° C. to 1,500° C.

According to the third aspect of the present invention, there is provided a single crystal wafer obtained by cutting, perpendicularly to the c axis, an oxide single crystal produced by the oxide single crystal production method described above.

According to the fourth aspect of the present invention, there is provided an oxide single crystal having a composition represented by $La_xSi_6O_{1.5x+12}$ (x: 8 to 10), a lattice constant a of 0.9646 nm (inclusive) to 0.9739 nm (exclusive), and a lattice constant c of 0.7077 nm (inclusive) to 0.7224 nm (exclusive), as an oxide single crystal produced by the oxide single crystal production method described above.

According to the fifth aspect of the present invention, there is provided an oxide single crystal production method characterized by using the Czochralski method, and adjusting the lattice constants by setting the solidification rate at 40% or less, as a method of producing the oxide single crystal according to the fourth aspect.

This oxide single crystal production method preferably uses a starting material obtained by adding, to a desired composition represented by $La_xSi_6O_{1.5x+12}$ (x: 8 to 10), $La_2O_3$ in excess by 0.1 to 5 wt % with respect to the total amount.

The present invention makes it possible to produce an oxide single crystal having a diameter of 15 mm or more, e.g., a practical size such as a one-inch size, and having no defects such as cracks.

BEST MODE FOR CARRYING OUT THE INVENTION

Embodiments of the present invention will be explained in detail below with reference to the accompanying drawings.

An oxide single crystal production method according to the present invention grows a single crystal having a chemical composition whose formula is represented by $RE_xSi_6O_{1.5x+12}$ (RE (a rare earth element): La, Ce, Pr, Nd, or Sm, x: 8 to 10), in the c-axis direction while controlling the solidification rate, by using a so-called Czochralski method (CZ method).

Figure 1:
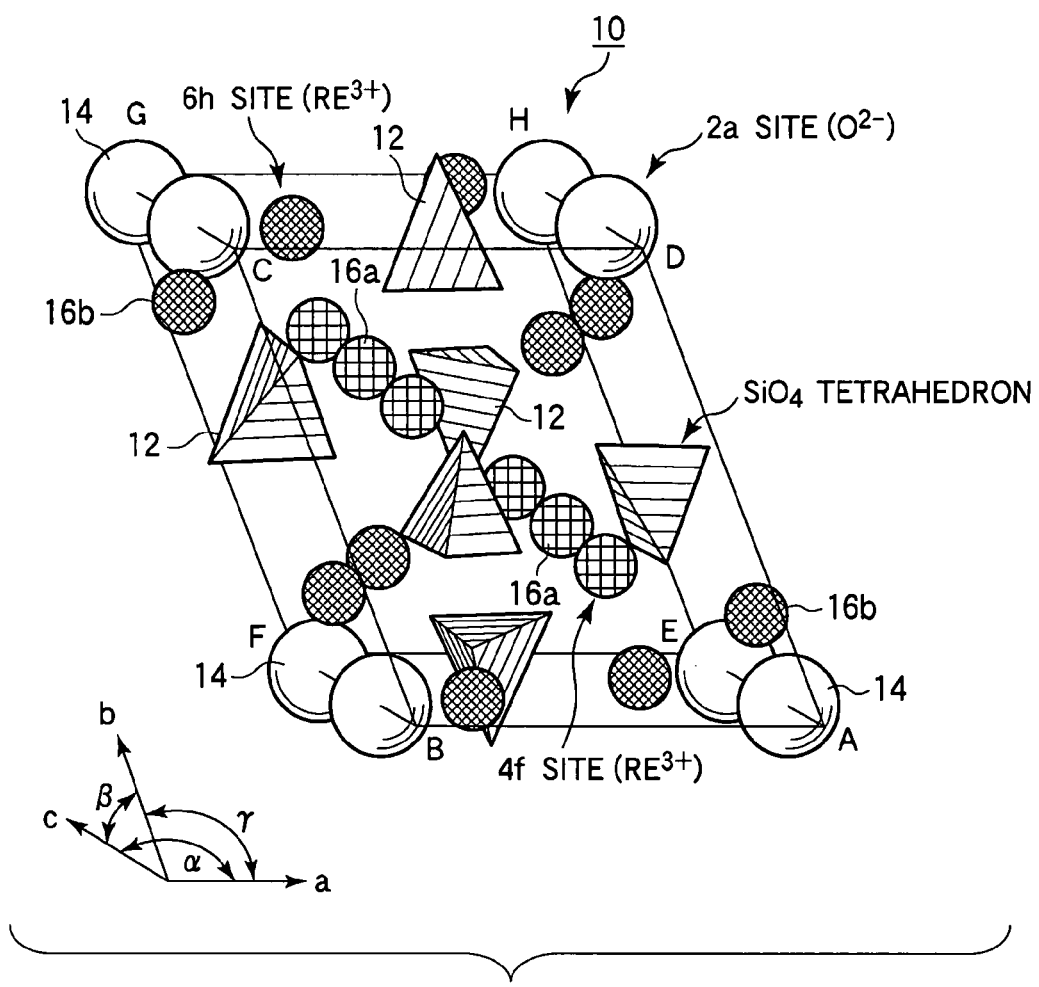
FIG. 1 is a view showing the structure of the unit lattice of a single crystal as an object of the present invention.

FIG. 1 is a view showing the structure of the unit lattice of a single crystal as an object of the present invention, in which the viewing point is the c-axis direction. A unit lattice 10 has a hexagonal system apatite structure containing six $SiO_4$ tetrahedrons 12, $O^{2-}$ 14 occupying the 2a site, and $RE^{3+}$ 16a and 16b respectively occupying the 4f site and 6h site. In this unit lattice, the c-axis direction is the direction of a side BF. Also, the direction of a side AB is the a-axis direction, the direction of a side BC is the b-axis direction.

In the unit lattice 10, an angle α made by the side AB in the a-axis direction with the side BF in the c-axis direction is 90°, an angle β made by the side BC in the b-axis direction with the side BF is 90°, and an angle γ made by the side AB with the side BC is 120°. The lengths of the sides AB and BC are equal, and different from the length of the side BF.

As the starting materials, oxides ($La_2O_3$, $CeO_2$, $Pr_2O_3$, $Nd_2O_3$, and $Sm_2O_3$) of rare earth elements and $SiO_2$ are preferably used. However, the starting materials are not limited to these oxides, and it is also possible to use, e.g., hydroxides, carbonates, oxalates, and chlorides. An oxide used as the starting material is preferably a powder, and its grain size is preferably 10 µm or less in order to increase the reactivity.

Various types of powder materials as described above are wet-mixed by using a ball mill, oscillating mill, agitated media mill, or the like. It is possible to use, e.g., water, alcohol, or acetone as the solvent. Also, to prevent mixing of inorganic impurities into the materials, a milling medium and milling vessel are preferably made of resins or coated with resins.

After being dried, the material mixture is placed in an alumina, zirconia, or platinum crucible, and sintered at 1,200° C. to 1,500° C. If the temperature is 1,200° C. or less, no desired compound is obtained. A temperature equal to or higher than 1,500° C. is preferably avoided because contamination from the crucible may occur. This sintering is preferably performed in the atmosphere or in oxygen.

Crystal growth is performed by a so-called Czochralski method (CZ method or pulling method). The Czochralski method is a versatile single crystal growth method, and has the characteristic feature that large high-quality crystals are obtained relatively easily. The present inventor focused on the Czochralski method because it is difficult for the floating zone melting method to obtain large crystals, and it is difficult for the Bridgman method to obtain large high-quality crystals. The present invention can grow an oxide single crystal having a diameter of 15 mm or more, e.g., a practical size such as a one-inch size, and having no defects such as cracks.

The material sintered as described above is placed in a refractory metal crucible (e.g., an iridium crucible), and melted by using a high-frequency heating device or the like. A seed crystal is brought into contact with this melt, and pulled up while being rotated.

Although the seed crystal can be cut out from a single crystal produced beforehand by the Czochralski method and can also be a single crystal produced by another production method such as the floating zone melting method, it is favorable to use a single crystal having few lattice defects. Also, a rod-like crystal in which the c-axis direction is the longitudinal direction is used as the seed crystal, and this longitudinal direction is matched with the pulling direction. This matches the crystal growth orientation with the c-axis direction. The c-axis direction is characterized by having a crystal growth rate higher than those of other growth orientations, and preventing easy formation of facets.

Figure 2:
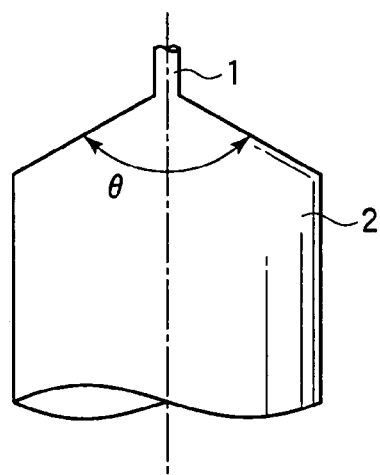
FIG. 2 is a view showing an initial growth angle θ of crystal growth.

As shown in FIG. 2, an initial growth angle θ of crystal growth is preferably 90° or more, and this angle makes it possible to obtain a large number of wafers having practical sizes. Note that in FIG. 2, reference numeral '1' denotes a seed crystal; and '2', a grown single crystal.

When growing an $La_xSi_6O_{1.5x+12}$ single crystal (LSO single crystal) as one form of $RE_xSi_6O_{1.5x+12}$ from a melt, for example, the initial crystal is generally richer in Si than the composition of the melt, the melt composition gradually becomes rich in La as crystal growth progresses, and the produced crystal also gradually becomes rich in La, as described previously. Consequently, the lattice constants of the grown crystal change, strains build up, and cracking readily occurs. To prevent this, the composition fluctuation must be minimized. Since the composition fluctuation decreases as the solidification rate (=crystal weight÷raw material weight) decreases, the solidification rate is preferably 45% or less.

In the LSO single crystal, the composition fluctuates during growth as described above, so the lattice constants favorably fall within predetermined ranges. No cracking occurs if a lattice constant a is 0.9646 nm (inclusive) to 0.9739 nm (exclusive), and a lattice constant c is 0.7077 nm (inclusive) to 0.7224 nm (exclusive).

The solidification rate is more preferably 40% or less, the lattice constant a is more preferably 0.9646 nm (inclusive) to 0.9731 nm (exclusive), and the lattice constant c is more preferably 0.7077 nm (inclusive) to 0.7198 nm (exclusive).

To obtain a high ion conductivity, the solidification rate is further favorably 30% or less in order to more reliably set the lattice constant a within the range of 0.9646 nm (inclusive) to 0.9739 nm (exclusive) and the lattice constant c within the range of 0.7077 nm (inclusive) to 0.7224 nm (exclusive).

Another method of controlling the lattice constants a and c when growing the LSO single crystal is to make the starting material richer in La than the desired composition. More specifically, the lattice constants in the initial stages of growth can be controlled within the desired ranges by making $La_2O_3$ excess by 0.1 to 5 wt % with respect to the desired composition. This also makes it possible to raise the solidification rate within the desired lattice constant ranges, and increase the number of wafers to be obtained by later processing, thereby increasing the yield.

In the single crystal grown as described above, the growth direction (the longitudinal direction of a circular column) coincides with the c-axis direction. Therefore, c-plane circular wafers can be obtained by cutting this single crystal perpendicularly to the c axis. The ion conductivity is high in the direction of thickness of this wafer. Accordingly, the wafer can be suitably used as, e.g., the partition material of a solid-state electrolytic fuel cell requiring a partition made of a thin and dense solid-state electrolyte having a low resistance.

Examples

The present invention will be explained in more detail below by way of its examples. $La_2O_3$, $CeO_2$, $Pr_2O_3$, $Nd_2O_3$, $Sm_2O_3$, and $SiO_2$ were used as starting materials, and compositions shown in Table 1 were obtained by weighing and mixing these materials. A predetermined amount of the material powder, nylon balls containing iron spheres, and water were placed in a ball mill, and mixed for a predetermined time. A powder obtained by drying the slurry was filled in a platinum crucible, and sintered at 1,400° C. The sintered material was placed in an iridium crucible and melted by using a high-frequency heating device, and a single crystal was grown by the Czochralski method in a nitrogen ($N_2$) ambient as a single crystal growth ambient at a pulling rate of 2 to 20 mm/h and a crystal rotational speed of 3 to 20 rpm. During the growth, the single crystal growth orientation was matched with the c-axis direction.

The presence/absence of cracks was determined by visually observing the single crystal thus obtained. Also, the ion conductivity of the grown single crystal was measured as follows. That is, a sample of the grown single crystal was made by processing the grown single crystal into a diameter of 10 mm and a thickness of 1 mm, and baking platinum (Pt) as electrodes on the two surfaces of the processed single crystal. The sample was held in the atmosphere at 600° C., and the ion conductivity was measured by the AC two-terminal method by using an impedance analyzer (Model 4192A manufactured by Hewlett-Packard). In addition, of the samples having undergone this ion conductivity measurement, the platinum film was removed from a single crystal containing La, the single crystal was milled in an agate mortar, and powder X-ray diffraction measurement (XRD) was performed. On the basis of the obtained diffraction peak, the lattice constants were calculated by the method of least squares by using the relations between the lattice plane spacing and the lattice constants in the hexagonal system. Table 1 also shows these observation and measurement results.

As shown in Table 1, comparing Example 1 with Examples 3 to 6 reveals that a high ion conductivity was obtained when RE (a rare earth element) was La for the same composition. A comparison of Examples 1 and 2 in which RE (a rare earth element) was La shows that the ion conductivity was higher in Example 1 in which x=9.33. The lattice constants a and c of Example 1 were larger than those of Example 2, and this presumably indicates that the crystal structure allowed easy movement of ions.

Although comparisons of Examples 1 and 7 to 10 demonstrate that the ion conductivity increased as the solidification rate increased, further comparing those examples with Comparative Example 1 shows that cracking occurred when the solidification rate was 45% or more. Also, comparing Examples 7 and 11 to 15 makes it possible to determine that the ion conductivity increased when excess La was added to the melt. However, cracking occurred when 6 wt % or more of La was added to the melt as in Comparative Example 2. In addition, comparisons of Examples 1, 2, and 7 to 15 and Comparative Examples 1 and 2 reveal that no cracking occurred when the lattice constant a was 0.9646 nm (inclusive) to 0.9739 nm (exclusive) and the lattice constant c was 0.7077 nm (inclusive) to 0.7224 nm (exclusive).

When the temperature gradient in the growth furnace pulling axis direction was as steep as about 40° C./cm in a zone of 50 mm from the melt, cracking occurred in the grown single crystal if the solidification rate was 40% or more, the lattice constant a was 0.9731 nm or more, and the lattice constant c was 0.7198 nm or more. However, when the refractory configuration was improved such that the temperature gradient in the growth furnace pulling axis direction was as moderate as about 20° C./cm, no cracking occurred if the solidification rate was less than 45%. The lattice constants a and c of the single crystal in which cracking occurred were respectively 0.9740 and 0.7224 nm.

When an LSO single crystal was grown by making the starting material composition excess in $La_2O_3$ in the growth furnace in which the refractory configuration was changed, it was possible to grow a single crystal having no defects such as cracks until the excess amount was 5 wt %, while cracking occurred in the conventional growth furnace having a steep temperature gradient if the excess amount was 2 wt % or more. However, cracking occurred in the grown single crystal if the excess amount was 6 wt %. In this case, the lattice constant a was 0.9739, and the lattice constant c was 0.7225 nm.

The lattice constants of single crystals in which cracking occurred were almost the same. This demonstrates that cracking occurs in a single crystal when the lattice constant a is about 0.9739 nm and the lattice constant c is about 0.7224 nm.

Cracking presumably occurred due to strains accumulated by, e.g., the changes in lattice constants of the grown single crystal, and it is probably possible to reduce the strains by the temperature gradient moderated by the improvement of the refractory configuration under the same conditions as when a growth furnace having a steep temperature gradient is used. Consequently, it was possible to stably grow crystals over broader ranges of the solidification rate, lattice constants, and starting material composition. However, it is favorable to minimize the strains in order to grow a single crystal having no defects such as cracks.

Note that the relationships between the lattice constants and ion conductivity in Examples 1, 2, and 7 to 15 indicate that the larger the lattice constants the larger the ion conductivity. Accordingly, it is perhaps possible to increase the ion conductivity by (partially or entirely) substituting Si with Ge having an ion radius larger than that of Si in $RE_xSi_6O_{1.5x+12}$.

TABLE 1

| Sample | $RE_xSi_6O_{1.5x+12}$ RE type | x Value | Excess La addition amount (wt %) | Solidification rate (%) |
|---|---|---|---|---|
| Example 1 | La | 9.33 | 0 | 25 |
| Example 2 | La | 8 | 0 | 25 |
| Example 3 | Ce | 9.33 | 0 | 25 |
| Example 4 | Pr | 9.33 | 0 | 25 |
| Example 5 | Nd | 9.33 | 0 | 25 |
| Example 6 | Sm | 9.33 | 0 | 25 |
| Example 7 | La | 9.33 | 0 | 30 |
| Example 8 | La | 9.33 | 0 | 10 |
| Example 9 | La | 9.33 | 0 | 20 |
| Example 10 | La | 9.33 | 0 | 40 |
| Example 11 | La | 9.33 | 0.1 | 30 |
| Example 12 | La | 9.33 | 0.5 | 30 |
| Example 13 | La | 9.33 | 1 | 30 |
| Example 14 | La | 9.33 | 3 | 30 |
| Example 15 | La | 9.33 | 5 | 30 |
| Comparative Example 1 | La | 9.33 | 0 | 45 |
| Comparative Example 2 | La | 9.33 | 6 | 30 |

| Sample | Crystal size diameter × length (mm) | Presence/ absence of cracks | Lattice constant a (nm) | Lattice constant c (nm) |
|---|---|---|---|---|
| Example 1 | φ35 × 26 L | Absent | 0.9717 | 0.7183 |
| Example 2 | φ35 × 26 L | Absent | 0.9646 | 0.7077 |
| Example 3 | φ35 × 26 L | Absent | — | — |
| Example 4 | φ35 × 26 L | Absent | — | — |
| Example 5 | φ35 × 26 L | Absent | — | — |
| Example 6 | φ35 × 26 L | Absent | — | — |
| Example 7 | φ35 × 30 L | Absent | 0.9719 | 0.7188 |
| Example 8 | φ35 × 13 L | Absent | 0.9714 | 0.7181 |
| Example 9 | φ35 × 20 L | Absent | 0.9716 | 0.7182 |
| Example 10 | φ35 × 37 L | Absent | 0.9731 | 0.7198 |
| Example 11 | φ35 × 30 L | Absent | 0.9717 | 0.7185 |
| Example 12 | φ35 × 30 L | Absent | 0.9720 | 0.7188 |
| Example 13 | φ35 × 30 L | Absent | 0.9720 | 0.7189 |
| Example 14 | φ35 × 30 L | Absent | 0.9727 | 0.7206 |
| Example 15 | φ35 × 30 L | Absent | 0.9734 | 0.7220 |
| Comparative Example 1 | φ35 × 42 L | Present | 0.9740 | 0.7224 |
| Comparative Example 2 | φ35 × 30 L | Present | 0.9739 | 0.7225 |

| Sample | Ion conductivity (S/cm) |
|---|---|
| Example 1 | $5.6 \times 10^{-2}$ |
| Example 2 | $2.4 \times 10^{-3}$ |
| Example 3 | $3.7 \times 10^{-2}$ |
| Example 4 | $2.2 \times 10^{-2}$ |
| Example 5 | $1.4 \times 10^{-2}$ |

TABLE 1-continued

| | |
|---|---|
| Example 6 | $2.0 \times 10^{-2}$ |
| Example 7 | $6.3 \times 10^{-2}$ |
| Example 8 | $3.7 \times 10^{-2}$ |
| Example 9 | $5.0 \times 10^{-2}$ |
| Example 10 | $7.0 \times 10^{-2}$ |
| Example 11 | $5.9 \times 10^{-2}$ |
| Example 12 | $6.8 \times 10^{-2}$ |
| Example 13 | $6.8 \times 10^{-2}$ |
| Example 14 | $7.0 \times 10^{-2}$ |
| Example 15 | $7.1 \times 10^{-2}$ |
| Comparative Example 1 | — |
| Comparative Example 2 | — |

INDUSTRIAL APPLICABILITY

The oxide single crystal according to the present invention is suitable as a fuel cell material using an oxide ion conductor.

The invention claimed is:

1. An oxide single crystal production method comprising:
preparing a starting material by mixing $La_2O_3$ and $SiO_2$; and
growing a single crystal with a crystal growth orientation in a C-axis direction by processing the starting material by using a Czochralski method to obtain a product of an oxide single crystal having a target composition represented by $La_{9.33}Si_6O_{26}$ with a lattice constant "a" of 0.9717 nm (inclusive) to 0.9734 nm (inclusive) and lattice constant "c" of 0.7185 nm (inclusive) to 0.7220 nm (inclusive),
wherein in said preparing, the starting material is prepared by adding an excess amount of $La_2O_3$ by 0.1 to 5 wt % with respect to the total amount of $La_2O_3$ and $SiO_2$ having a ratio defined by the target composition, such that the lattice constants of the oxide single crystal are "a" is 0.9646 nm to 0.9739 nm and "c" is 0.7077 nm to 0.7224 nm in an initial stage of said growing, and
wherein said growing obtains the product of the oxide single crystal by setting a solidification rate (grown crystal weight÷charged raw material weight) at less than 45%, to minimize composition fluctuation of the single crystal due to the excess amount of $La_2O_3$.

2. The oxide single crystal production method according to claim 1, wherein said preparing includes wet-mixing the $La_2O_3$, and the $SiO_2$ to form a mixture, drying and molding the mixture, and then sintering the mixture at a temperature of 1,200 to 1,500° C., and said growing includes growing the single crystal from a melt of the mixture thus sintered.

3. The oxide single crystal production method according to claim 1, wherein said preparing uses a powder of $La_2O_3$ and $SiO_2$ having a grain size of 10 µm or less.

4. The oxide single crystal production method according to claim 1, wherein said growing uses a seed crystal formed of a rod-like crystal with its longitudinal direction in the c-axis direction, and sets the longitudinal direction to match a pulling direction of the seed crystal.

5. The oxide single crystal production method according to claim 4, wherein said growing sets an initial growth angle of the single crystal at 90° or more relative to the seed crystal.

6. The oxide crystal production method according to claim 4, wherein said growing pulls up the seed crystal at a rate of 2 to 20 mm/h, and rotates the seed crystal to a speed of 3 to 20 rpm.

7. The oxide single crystal production method according to claim 1, wherein said growing sets the solidification rate of 40% or less.

8. A single crystal wafer production method comprising:
preparing a starting material by mixing $La_2O_3$ and $SiO_2$;
growing a single crystal with a crystal growth orientation in a c-axis direction by processing the starting material by using a Czochralski method to obtain a product of an oxide single crystal having a target composition represented by $La_{9.33}Si_6O_{26}$ with a lattice constant "a" of 0.9717 nm (inclusive) to 0.9734 nm (inclusive) and a lattice constant "c" of 0.7185 nm (inclusive) to 0.7220 nm (inclusive); and
cutting the product perpendicularly to the c-axis direction to form a single crystal wafer from the product,
wherein said preparing prepares the starting material by adding an excess amount of $La_2O_3$ by 0.1 to 5 wt % with respect to a total amount of $La_2O_3$ and $SiO_2$, having a ratio defined by the target composition, such that the lattice constants of the oxide single crystal are "a" is 0.9646 nm to 0.9739 nm and "c" is 0.7077 nm to 0.7224 nm in an initial stage of said growing, and
wherein said growing obtains the product of the oxide single crystal by setting a solidification rate (grown crystal weight÷charged raw material weight) at less than 45%, to minimize composition fluctuation of the single crystal due to the excess amount of $La_2O_3$.

9. The single crystal wafer production method according to claim 8, wherein said preparing includes wet-mixing the $La_2O_3$ and the $SiO_2$ to form a mixture, drying and molding the mixture at a temperature of 1,200 to 1,500° C., and said growing includes growing the single crystal from a melt of the mixture thus sintered.

10. The single crystal wafer production method according to claim 8, wherein said preparing uses a powder of $La_2O_3$ and $SiO_2$ having a grain size of 10 µm or less.

11. The single crystal wafer production method according to claim 8, wherein said growing uses a seed crystal formed of a rod-like crystal with its longitudinal direction in the c-axis direction, and sets the longitudinal direction to match a pulling direction of the seed crystal.

12. The single crystal wafer production method according to claim 11, wherein said growing sets an initial growth angle of the single crystal at 90° or more relative to the seed crystal.

13. The single crystal wafer production method according to claim 11, wherein said growing said growing pulls up the seed crystal at a rate of 2 to 20 mm/h, and rotates the seed crystal at a speed of 3 to 20 rpm.

14. The single crystal wafer production method according to claim 8, wherein said growing sets the solidification rate at 40% or less.

* * * * *